(12) United States Patent  
Cheng et al.

(10) Patent No.: US 9,401,303 B2
(45) Date of Patent: Jul. 26, 2016

(54) HANDLER WAFER REMOVAL BY USE OF SACRIFICIAL INERT LAYER

(71) Applicant: GLOBALFOUNDRIES Inc., Grand Cayman (KY)

(72) Inventors: Kangguo Cheng, Schenectady, NY (US); Jonathan E. Faltermeier, Delanson, NY (US); Mukta G. Farooq, Hopewell Junction, NY (US); Wei Lin, Albany, NY (US); Spyridon Skordas, Troy, NY (US); Kevin R. Winstel, East Greenbush, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 76 days.

(21) Appl. No.: 14/449,185

(22) Filed: Aug. 1, 2014

(65) Prior Publication Data

US 2016/0035616 A1 Feb. 4, 2016

(51) Int. Cl.
*H01L 21/762* (2006.01)
*H01L 27/12* (2006.01)
*H01L 21/02* (2006.01)

(52) U.S. Cl.
CPC .... *H01L 21/76251* (2013.01); *H01L 21/02304* (2013.01); *H01L 21/02334* (2013.01); *H01L 21/02345* (2013.01); *H01L 27/1203* (2013.01)

(58) Field of Classification Search
CPC . H01L 27/146; H01L 27/14645; H01L 29/00; H01L 21/762
See application file for complete search history.

(56) References Cited

U.S. PATENT DOCUMENTS

| 5,034,972 | A | 7/1991 | Schomburg et al. |
| 5,846,638 | A | 12/1998 | Meissner |
| 6,645,797 | B1 | 11/2003 | Buynoski et al. |
| 7,348,258 | B2 | 3/2008 | Henley et al. |
| 7,670,928 | B2 | 3/2010 | Shaheen et al. |
| 7,710,371 | B2 | 5/2010 | Mei et al. |

(Continued)

FOREIGN PATENT DOCUMENTS

| WO | 2011160051 A2 | 12/2011 |
| WO | 2012112937 A2 | 8/2012 |

OTHER PUBLICATIONS

Bagchi et al., "A new procedure for measuring the decohesion energy for thin ductile films on substrates," Journal of Materials Research, vol. 9, No. 7, Jul. 1994, pp. 1734-1741.

(Continued)

*Primary Examiner* — Tung X Nguyen
*Assistant Examiner* — Zannatul Ferdous
(74) *Attorney, Agent, or Firm* — Heslin Rothenberg Farley & Mesiti P.C.

(57) ABSTRACT

The present invention relates generally to semiconductor structures and methods of manufacture and, more particularly, to the temporary bonding of a semiconductor wafer to handler wafer during processing. The semiconductor wafer may be temporarily bonded to the handler wafer by forming a sacrificial layer on a surface of a handler wafer, forming a first dielectric layer on a surface of the sacrificial layer, forming a second dielectric layer on a surface of a semiconductor wafer, and directly bonding the first dielectric layer and the second dielectric layer to form a bonding layer. After the semiconductor wafer is processed, it may be removed from the handler wafer along with the bonding layer by degrading the sacrificial layer with infrared radiation transmitted through the handler wafer.

20 Claims, 6 Drawing Sheets

(56) References Cited

U.S. PATENT DOCUMENTS

| | | |
|---|---|---|
| 8,129,256 B2 | 3/2012 | Farooq et al. |
| 8,394,664 B2 | 3/2013 | Nicholas et al. |
| 8,557,632 B1 | 10/2013 | Or-Bach et al. |
| 8,580,615 B2 | 11/2013 | Schuegraf et al. |
| 2003/0157782 A1* | 8/2003 | Kellar .................. H01L 23/481 438/455 |
| 2005/0274454 A1 | 12/2005 | Extrand |
| 2008/0191310 A1* | 8/2008 | Wu ..................... H01L 21/2007 257/508 |
| 2010/0140591 A1 | 6/2010 | Nicholas et al. |
| 2011/0309382 A1 | 12/2011 | Löwgren |
| 2013/0045570 A1 | 2/2013 | Schuegraf et al. |
| 2014/0070215 A1 | 3/2014 | Bedell et al. |
| 2015/0249109 A1* | 9/2015 | Wang ................ H01L 27/14621 438/70 |

OTHER PUBLICATIONS

Doany et al., "Laser release process to obtain freestanding multilayer metal-polyimide circuits," IBM J. Res. Develop., vol. 41, No. 1/2, Jan./Mar. 1997, pp. 151-157.

Skordas et al., "Wafer-Scale oxide Fusion Bonding and Wafer Thinning Development for 3D Systems Integration: Oxide fusion wafer bonding and wafer thinning development for TSV-last integration," 3rd IEEE International Workshop on Low Temperature Bonding for 3D Integration (LTB-3D), May 22-23, 2012, pp. 203-208.

* cited by examiner

HANDLER WAFER REMOVAL BY USE OF SACRIFICIAL INERT LAYER

BACKGROUND

The present invention relates generally to semiconductor structures and methods of manufacture and, more particularly, to the temporary joining of a semiconductor wafer to a handler wafer during processing.

Semiconductor devices are typically made by processing semiconductor wafers. Typically, the semiconductor wafer is attached to a handler wafer to secure it during processing. The semiconductor wafer may be attached to the handler wafer using an adhesive that is applied to the semiconductor wafer, the handler wafer, or both. After the semiconductor wafer is processed, it may be separated from the handler wafer by dissolving the bonded adhesive using, for example, solvents or lasers.

SUMMARY

According to one embodiment of the present invention, a method is disclosed. The method may include: forming a sacrificial layer on a surface of a handler wafer; forming a first dielectric layer on a surface of the sacrificial layer; forming a second dielectric layer on a surface of a semiconductor wafer; directly bonding the first dielectric layer and the second dielectric layer to form a bonding layer; processing the semiconductor wafer; and removing the processed semiconductor wafer and the bonding layer from the handler wafer by degrading the sacrificial layer with infrared radiation, the infrared radiation passing through the handler wafer. The sacrificial layer may be composed of an inert material.

According to another embodiment of the present invention, a method is disclosed. The method may include: releasing a processed semiconductor wafer and a bonding layer from a handler wafer by degrading a sacrificial layer using radiation that is transmitted through the handler wafer. The sacrificial layer may be formed between the handler wafer and the bonding layer present on the processed semiconductor wafer.

According to another embodiment of the present invention, a structure is disclosed. The structure may include: a sacrificial layer on a surface of a handler wafer; a first dielectric layer on a surface of the sacrificial layer; a second dielectric layer directly bonded to a surface of the first dielectric layer; and a semiconductor wafer on a surface of the second dielectric layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor structures and methods of manufacture and, more particularly, to the temporary bonding of a semiconductor wafer, also referred as a device wafer, to a carrier wafer or handler wafer (hereinafter "handler") during processing. Conventional wafer processing methods may include temporarily bonding a semiconductor wafer to a handler, which typically may be composed on an optically transparent material, such as glass, quartz, or sapphire. An adhesive medium may be used to temporarily bond the device wafer to the handler.

After the semiconductor wafer is processed (e.g., backside thinning, solder connection formation, and chip dicing), the semiconductor wafer may be de-bonded from the handler.

During a typical de-bonding process, optical or ultraviolet lasers may be directed to the adhesive medium through the optically transparent handler in order to ablate the adhesive medium and to enable the release of the processed semiconductor wafer from the handler. However, this method of de-bonding has inherent high costs due to the use of expensive handlers that need to be transparent to ultraviolet lasers used for laser ablation. The resulting heat from the laser ablation process may also cause damage to the semiconductor wafer. Additionally, the use of adhesives to temporarily bond the wafers can result in residue on the handlers upon completion of the de-bonding process resulting in process yield issues. Embodiments by which to temporarily bond a semiconductor wafer to a handler, without the use of an optically transparent handler, a chemical adhesive, and subsequent laser ablation, by utilizing oxide bonding methods and an inert material layer are described below with reference to FIGS. 1-6.

Figure 1:
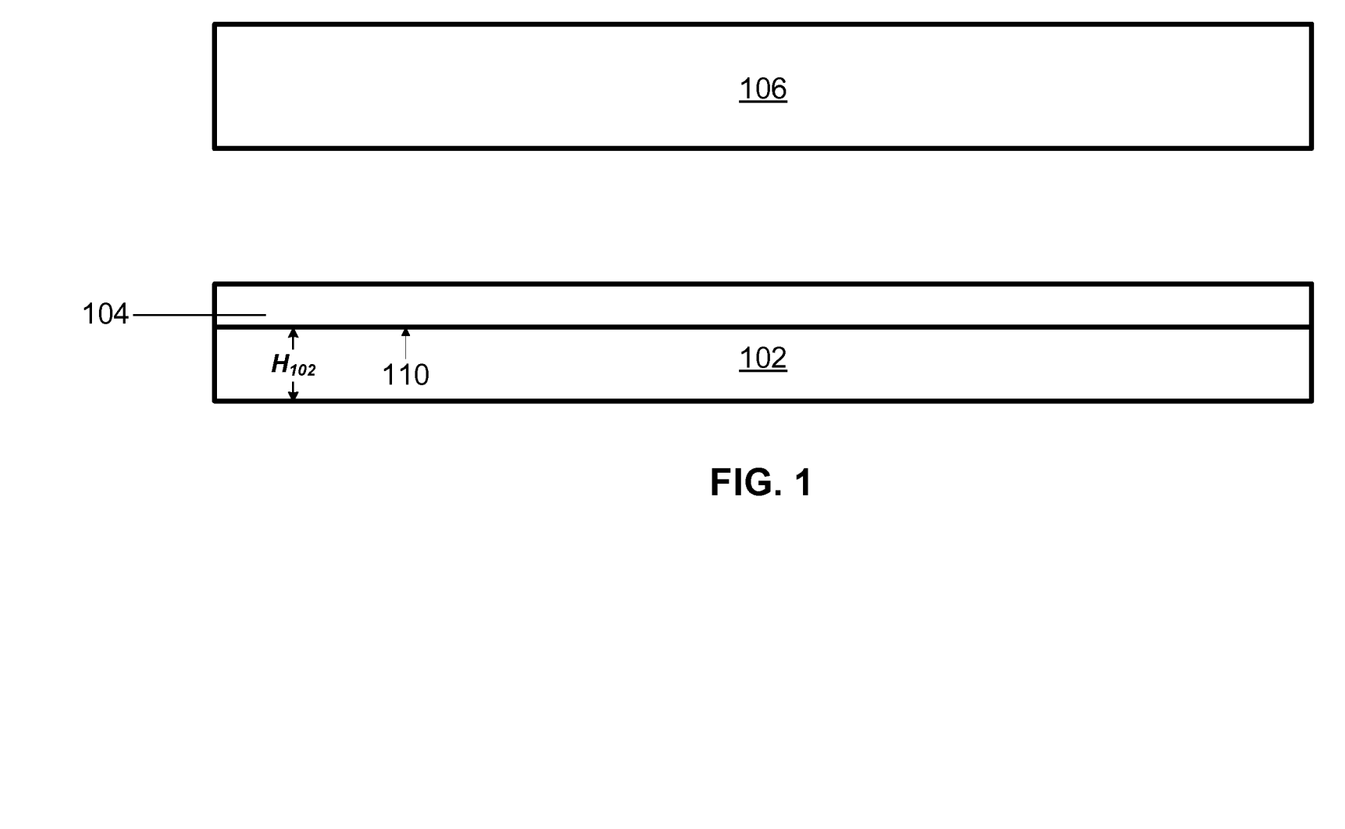
FIG. 1 is a cross section view of a handler and semiconductor wafer illustrating the depositing of a sacrificial inert layer on a surface of a handler, in accordance with an embodiment of the present invention.

Referring now to FIG. 1, a cross section view of a handler 102 and a semiconductor wafer 106 is shown. FIG. 1 illustrates depositing a sacrificial inert layer 104 on a surface 110 of a handler 102. In an embodiment, the sacrificial inert layer 104 may be composed of amorphous carbon. The sacrificial inert layer 104 may be deposited on the surface 110 of the handler 102 using a conventional deposition technique, such as, for example, chemical vapor deposition (CVD), plasma enhanced CVD (PECVD), thermal CVD (THCVD), sputtering, or spin-on deposition.

In an embodiment, the handler 102 may be composed of a material, such as, for example, undoped or lightly doped silicon, that is transparent to infrared (hereinafter "IR") radiation. It should be noted that embodiments of the present invention do not require the handler 102 to be an optically transparent handler as in conventional handler/wafer bonding processes. The handler 102 may have a height $H_{102}$ ranging from approximately 400 µm to approximately 1000 µm and an overall diameter that corresponds to the diameter of a corresponding semiconductor wafer 106. It should be noted that the thickness of the handler can vary depending on its diameter and the requirements for structural stability.

The semiconductor wafer 106 may include a typical wafer known in the art of which may include multiple layers and materials. The multiple layers may consist of semiconductor materials, dielectric materials, and conductive materials. The semiconductor materials may include any semiconductor materials well known in the art, such as, for example, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Non-limiting examples of compound semiconductor materials include gallium arsenide, indium arsenide, and indium phosphide. Typically, the semiconductor wafer 106 may be about, but is not limited to, several hundred microns thick. The semiconductor wafer 106 may have a diameter of typical wafers commonly used in the art, such as, but not limited to, 100 mm, 125 mm, 150 mm, 200 mm, 300 mm, or 450 mm.

Figure 2:
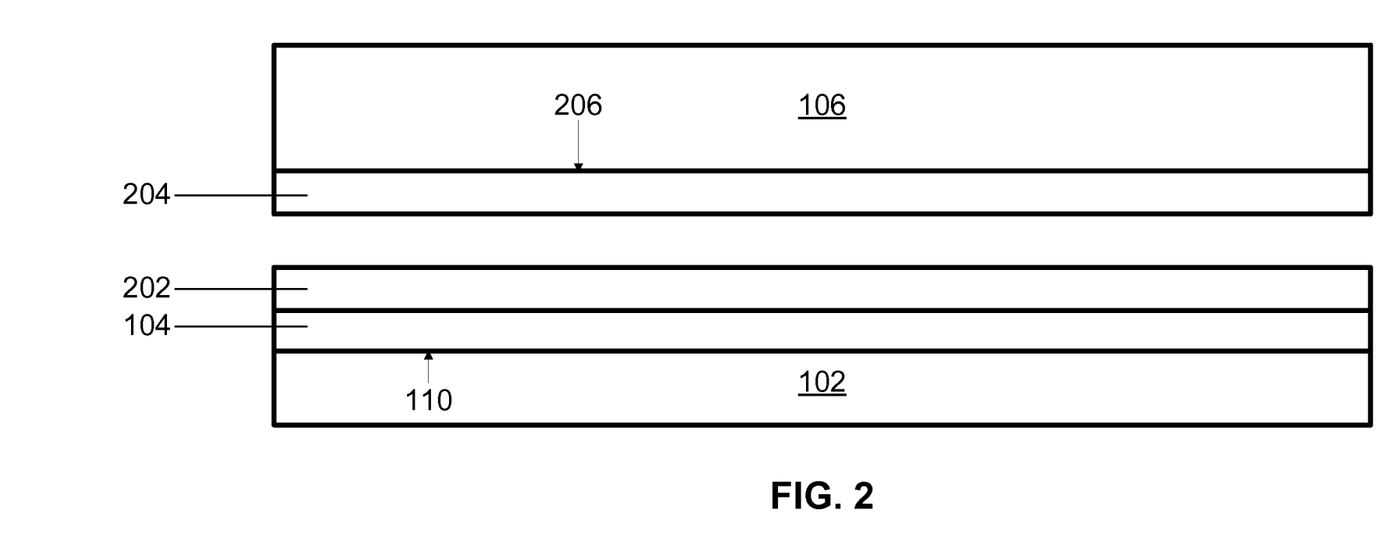
FIG. 2 is a cross section view of the handler and the semiconductor wafer illustrating the forming of a first layer on the sacrificial inert layer and a second layer on a front side of the semiconductor wafer, in accordance with an embodiment of the present invention.

Referring now to FIG. 2, a cross section view of the handler 102 and the semiconductor wafer 106 is shown. FIG. 2 illustrates forming a first layer 202 on the sacrificial inert layer 104 and a second layer 204 on a front side 206 of the semiconductor wafer 106. In an embodiment, the first layer 202 and the second layer 204 may both be composed of a dielectric material, such as, for example, an oxide. It should be noted that embodiments are contemplated in which the first layer 202 and the second layer 204 are composed of materials having the same composition, and in which the composition of the first layer 202 is different than the composition of the second layer 204. The first layer 202 and the second layer 204 may be deposited using a conventional deposition technique, such as, for example, CVD, PECVD, THCVD, sputtering, or spin-on deposition.

Figure 3:
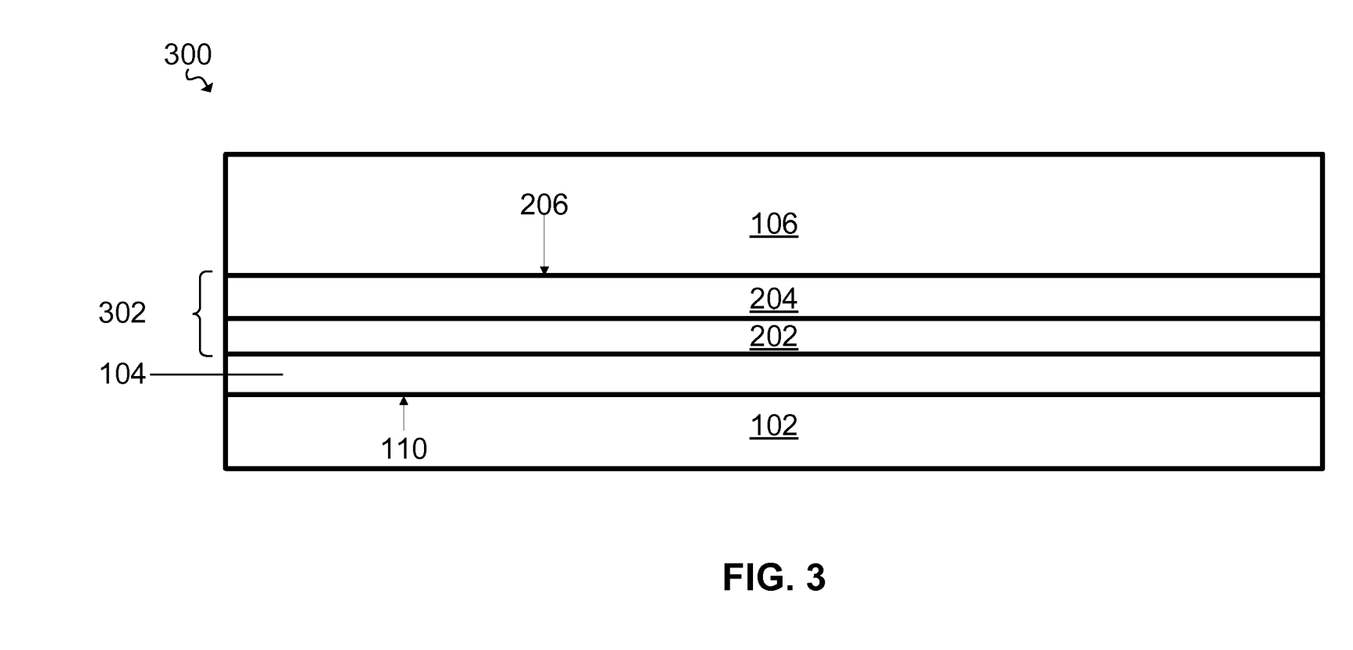
FIG. 3 is a cross section view illustrating the joining of the first layer and the second layer to form a structure, in accordance with an embodiment of the present invention.

Referring now to FIG. 3, a cross section view of a structure 300 is shown. FIG. 3 illustrates joining the first layer 202 and the second layer 204 to form the structure 300. The first layer 202 and the second layer 204 may be joined by direct bonding (i.e., without the use of any additional intermediate layers), such as, for example, dielectric bonding. In an embodiment, the first layer 202 and the second layer 204 may be joined using oxide bonding. The oxide bonding may involve a multiple step bonding layer preparation process prior to bonding that may involve, among other steps, bonding layer deposition, thermal or ultraviolet radiation anneal, plasma activation, and aqueous clean followed by a wafer alignment.

In an embodiment, the oxide bonding may then be performed by subjecting the semiconductor wafer 106, the handler 102, the first layer 202, the inert sacrificial layer 104, and the second layer 204 to plasma activation, typically utilizing nitrogen plasma. Next, the first layer 202 and the second layer 204 may be cleaned using deionized water (DIW). Following the cleaning, the semiconductor wafer 106 and the handler 102 may be loaded into a bonding system, such that the first layer 202 and the second layer 204 are facing each other. A system of microscopes may be used to position and align the semiconductor wafer 106 and the handler 102.

Once the semiconductor wafer 106 and the handler 102 are aligned, the first layer 202 may be pushed into the second layer 204 at a determined temperature range, pressure range, and time that is sufficient to allow the first layer 202 and the second layer 204 to join and form a single bonding layer 302. In an embodiment, the bonding process may be conducted in a chamber at a temperature ranging from approximately 20° C. to approximately 300° C., a pressure ranging from approximately 1 microTorr to approximately 760 Torr, and for a time of approximately 1 min to approximately 30 min. It should be noted that other temperature, pressure, and time ranges, effective to cause the first layer 202 and second layer 204 to join, may be used. After the single bonded layer 302 is formed, an annealing process may be performed to help fully strengthen the bond. During this annealing process, the temperature may remain between approximately 300° C. and 400° C. for several hours. It should be noted that another temperature range, effective to cause the bond to strengthen, may be used. It should be noted that lower annealing temperatures are possible, including approximately 200° C., but would lead to longer annealing times.

Figure 4:
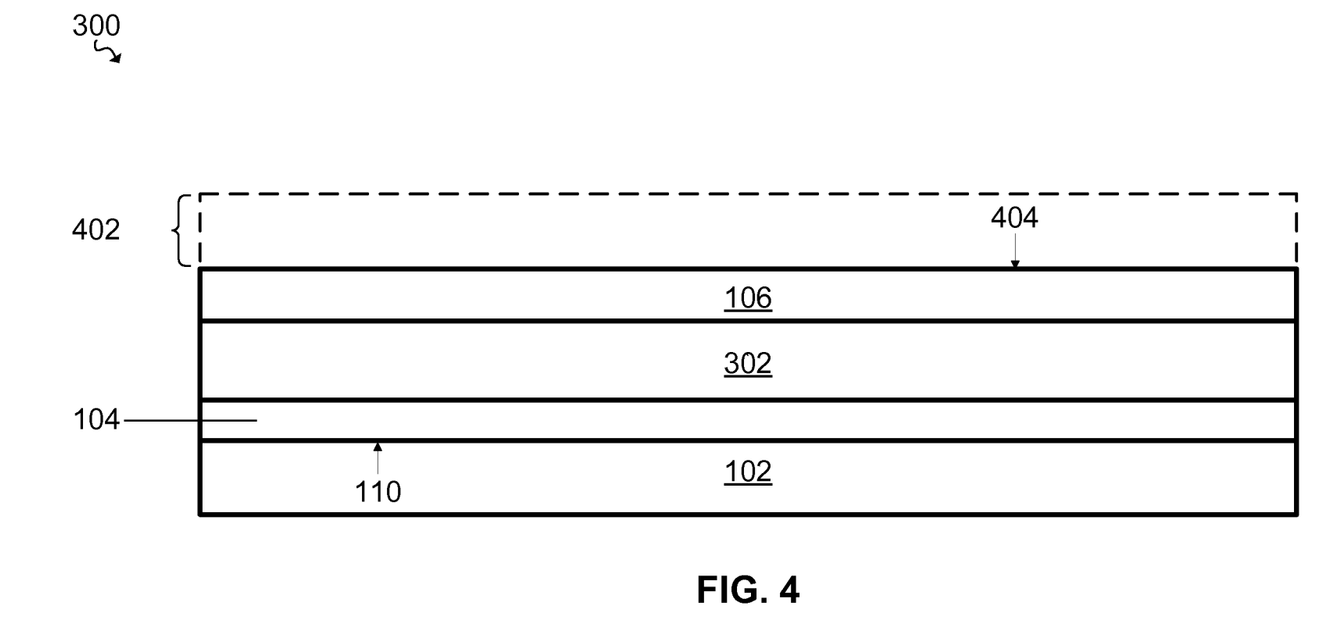
FIG. 4 is a cross section view illustrating the removal of a portion of the semiconductor wafer during semiconductor processing, in accordance with an embodiment of the present invention.

Referring now to FIG. 4, a cross section view of the structure 300 is shown. FIG. 4 illustrates removing a portion 402 of the semiconductor wafer 106 during semiconductor processing. In an embodiment, the portion 402 may be removed using a nonselective process, such as, for example, grinding, wet chemical thinning, chemical mechanical planarization (CMP), or a combination of multiple processes. The portion 402 may be removed to expose a thinned backside surface 404 of the semiconductor wafer 106, to the point where typically conductive elements are revealed. These elements are usually conductive through-silicon vias. Although not shown in FIG. 4, chip connections, such as, for example, controlled collapse chip connection (C4), may be formed on the thinned backside surface 404 that are electrically connected to the front side 206 of the semiconductor wafer 106.

Figure 5:
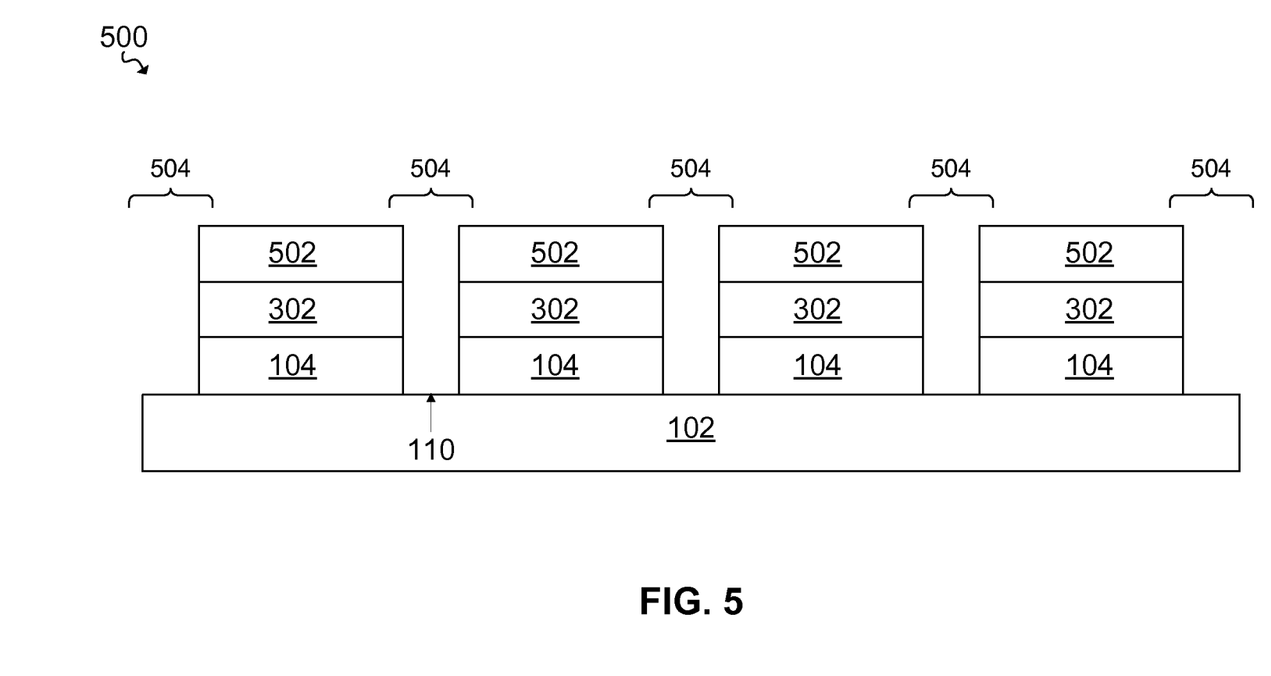
FIG. 5 is a cross section view illustrating dicing the semiconductor wafer into individual die, in accordance with an embodiment of the present invention.

Referring now to FIG. 5, a cross section view of a structure 500 is shown. FIG. 5 illustrates dicing the semiconductor wafer 106 (FIG. 4) into a plurality of individual die 502. The semiconductor wafer 106 may be diced using a conventional wafer dicing technique, such as, for example, scribing and breaking, mechanical sawing, or laser cutting. In an embodiment, the wafer dicing may form gaps 504 between the individual die 502. The gaps 504 may extend from an upper surface of the die to the handler 102. In an embodiment, the gaps 504 may stop at the surface 110 of the handler 102.

Figure 6:
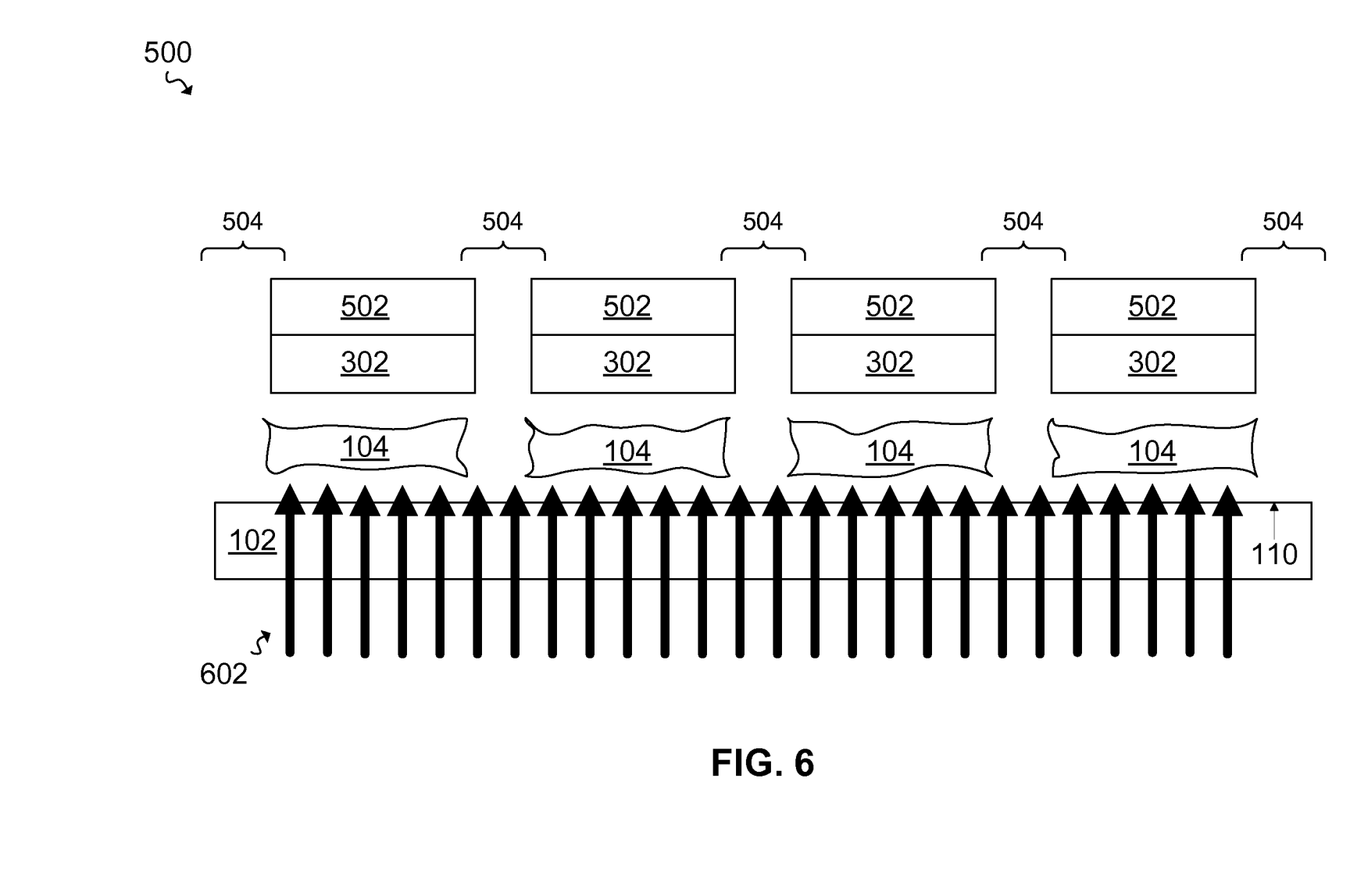
FIG. 6 is a cross section view illustrating a de-bonding process in which sacrificial inert layer is removed to separate the die from the handler, in accordance with an embodiment of the present invention.

Referring now to FIG. 6, a cross section view of the structure 500 is shown. FIG. 6 illustrates a de-bonding process in which sacrificial inert layer 104 is removed to separate the die 502 from the handler 102. Typically the individual die 502 can be held by adhesive tape used in dicing applications during the release from the handler 102 or by other means (i.e., vacuum chuck). During the de-bonding process, the handler 102 may be exposed to IR radiation 602. Because, as noted above, the handler 102 may be composed of a material that is transparent to IR radiation, the IR radiation 602 may travel through the handler 102 and impact the sacrificial inert layer 104. The IR laser irradiation 602 may partially or completely degrade, decompose, or ablate the sacrificial inert layer 104. As the sacrificial inert layer 104 is degraded by the IR radiation 602, it may release the single bonded layer 302, and the die 502, from the handler 102. In an embodiment, the sacrificial inert layer 104 may absorb much of the IR laser irradiation 602, thereby minimizing any thermal strain on the single bonded layer 302 and the die 502. It should be noted that the IR radiation 602 may have a much lower energy than a typical source of radiation (e.g., optical lasers) used in conventional de-bonding techniques.

In an embodiment, an optional ashing step may be used to remove any residue of the sacrificial inert layer 104 that may remain on the single bonded layer 302 after the de-bonding process. After the de-bonding process, the die 502 may be further processed in typical semiconductor bond and assembly operations. The single bonded layer 302 may remain on the die 502 or may later be removed using a conventional technique such as etching or planarization.

Embodiments of the present invention may reduce process yield issues while reducing semiconductor wafer processing costs as compared to conventional techniques. In an embodiment, a sacrificial inert layer may be applied to a handler and then may be directly bonded by, for example, oxide bonding, to a semiconductor wafer. The semiconductor wafer may then be processed. During the de-bonding process, the sacrificial inert layer may be removed, thereby releasing the processed semiconductor wafer, by exposing it to IR radiation transmitted though the handler.

This may allow for the use of a handler that is composed of a less expensive material than conventional handlers such as, for example, undoped or lightly doped silicon. Because the IR radiation may have a much lower energy than a typical source of radiation used in handler/wafer de-bonding techniques, such as optical or ultraviolet lasers, the IR irradiation may be less likely to damage the chips. Also, the sacrificial inert layer may absorb most of the IR irradiation, minimizing any thermal strain on the processed semiconductor wafer. In addition, because embodiments may use direct bonding instead of an adhesive medium to join the semiconductor wafer to the handler, unwanted adhesive residues may be minimized. Furthermore, the use of oxide bonding can yield wafer bonding alignment overlay that is within about 1 micron, which is at least one order of magnitude better than the performance achieved through thermal compression bonding with the use of adhesives.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a sacrificial layer on a surface of the handler wafer, wherein the sacrificial layer comprises an inert material, and the sacrificial layer is formed to be degradable by infrared radiation;
   forming a first dielectric layer on a surface of the sacrificial layer;
   forming a second dielectric layer on a surface of a semiconductor wafer;
   directly bonding the first dielectric layer and the second dielectric layer to form a bonding layer, the bonding layer joining the semiconductor wafer and the handler wafer; and
   separating the semiconductor wafer with the bonding layer from the handler wafer by degrading the sacrificial layer with infrared radiation, the infrared radiation passing through the handler wafer to degrade the sacrificial layer and thereby release the semiconductor wafer with the bonding layer from the handler wafer.

2. The method of claim 1, wherein the inert material comprises amorphous carbon.

3. The method of claim 1, wherein the handler wafer comprises a silicon substrate.

4. The method of claim 1, wherein the first dielectric layer comprises an oxide.

5. The method of claim 1, wherein the second dielectric layer comprises an oxide.

6. The method of claim 1, wherein the directly bonding the first dielectric layer and the second dielectric layer to form a bonding layer comprises forming a dielectric bond.

7. The method of claim 1, wherein the directly bonding the first dielectric layer and the second dielectric layer to form a bonding layer comprises forming an oxide bond.

8. The method of claim 1, further comprising processing the semiconductor wafer, wherein the processing includes:
   thinning the semiconductor wafer;
   forming a plurality of semiconductor devices, each of the plurality of semiconductor devices comprising the semiconductor wafer, the first dielectric layer, and the second dielectric layer; and
   dicing the plurality of semiconductor devices to form a plurality of semiconductor dies.

9. The method of claim 1, further comprising:
   annealing the bonding layer by heating the handler wafer, the sacrificial layer, the bonding layer, and the semiconductor wafer to a temperature ranging from 300° C. to 400° C.

10. The method of claim 1, further comprising:
performing an ashing process to remove any remaining portion of the sacrificial layer from a surface of the bonding layer.

11. A method comprising:
releasing a processed semiconductor wafer and a bonding layer from a handler wafer by degrading an infrared degradable sacrificial layer using infrared radiation that is transmitted through the handler wafer, wherein the infrared degradable sacrificial layer resides between the handler wafer and the bonding layer present on the processed semiconductor wafer and the infrared degradable sacrificial layer is distinct from the bonding layer which joined the processed semiconductor wafer and the handler wafer.

12. The method of claim 11, wherein the sacrificial layer comprises amorphous carbon.

13. The method of claim 11, wherein the bonding layer comprises a first dielectric layer directly bonded to a second dielectric layer.

14. The method of claim 11, wherein the sacrificial layer is pre-selected to be degradable by the infrared radiation.

15. The method of claim 11, wherein the handler wafer comprises a silicon wafer.

16. The method of claim 11, further comprising:
performing an ashing process to remove any remaining portion of the sacrificial layer from a surface of the bonding layer.

17. A structure comprising:
a sacrificial layer on a surface of a handler wafer, the sacrificial layer being degradable by infrared radiation;
a first dielectric layer on a surface of the sacrificial layer;
a second dielectric layer directly bonded to a surface of the first dielectric layer, wherein together the first dielectric layer and directly bonded second dielectric layer form a bonding layer on the surface of the sacrificial layer; and
a semiconductor wafer on a surface of the second dielectric layer.

18. The structure of claim 17, wherein the handler wafer comprises silicon.

19. The structure of claim 17, wherein the sacrificial layer comprises amorphous carbon.

20. The structure of claim 17, wherein the first dielectric layer and the second dielectric layer comprise an oxide.

* * * * *